United States Patent
Finteis

(10) Patent No.: US 7,159,157 B2
(45) Date of Patent: Jan. 2, 2007

(54) APPARATUS AND METHOD FOR TESTING A DEVICE FOR STORING DATA

(75) Inventor: Thomas Finteis, Munich (DE)

(73) Assignee: Infineon Technologies AG, Munich (DE)

( * ) Notice: Subject to any disclaimer, the term of this patent is extended or adjusted under 35 U.S.C. 154(b) by 370 days.

(21) Appl. No.: 10/173,285

(22) Filed: Jun. 17, 2002

(65) Prior Publication Data

US 2003/0014702 A1    Jan. 16, 2003

(30) Foreign Application Priority Data

Jun. 20, 2001    (DE) ................................ 101 296 25

(51) Int. Cl.
*G11C 29/00* (2006.01)

(52) U.S. Cl. .................. 714/718; 714/25; 714/735; 365/201

(58) Field of Classification Search ............... 714/718, 714/735, 819, 824, 25
See application file for complete search history.

(56) References Cited

U.S. PATENT DOCUMENTS

| | | | | |
|---|---|---|---|---|
| 5,966,388 A * | 10/1999 | Wright et al. | ................ | 714/719 |
| 6,154,860 A * | 11/2000 | Wright et al. | ................ | 714/718 |
| 6,175,529 B1 * | 1/2001 | Otsuka et al. | ................ | 365/201 |
| 6,473,346 B1 * | 10/2002 | Kim et al. | ................ | 365/201 |
| 6,574,763 B1 * | 6/2003 | Bertin et al. | ................ | 714/738 |
| 6,581,171 B1 * | 6/2003 | Krause | ................ | 714/718 |
| 6,651,202 B1 * | 11/2003 | Phan | ................ | 714/733 |
| 6,671,836 B1 * | 12/2003 | Lai et al. | ................ | 714/718 |
| 6,779,139 B1 * | 8/2004 | Haraguchi et al. | ................ | 714/718 |

FOREIGN PATENT DOCUMENTS

JP        2000329828 A    *  11/2000

OTHER PUBLICATIONS

Sugibayashi et al., "A Distributive Serial Multi-Bit Parallel Test Scheme for Large Capacity DRAMs," IECE Trans. Electron., vol. E77-C (No. 8), p. 1323-1327, (1994).

* cited by examiner

*Primary Examiner*—Albert DeCady
*Assistant Examiner*—John P. Trimmings
(74) *Attorney, Agent, or Firm*—Jenkins, Wilson, Taylor & Hunt, P.A.

(57) ABSTRACT

The present invention provides an apparatus for testing a device (102) for storing data, which has a device for comparing actual data with set point data for individual storage areas and a device for supplying a comparison signal (106) for each storage area, which comparison signal (106) has a first state if the actual data is identical to the set point data, and a second state if the actual data is not identical to the set point data. The testing apparatus has a circuit board (100) on which the storage device (102) can be mounted, and a device (108) for comparing the states of the comparison signals at the pins of the storage device (102) which are assigned to the comparison signals (106), and for supplying a status signal (110) which, as a function of the state of the comparison signal, has a first state if the storage device (102) is operationally capable, and has a second state if the storage device (102) is defective.

21 Claims, 1 Drawing Sheet

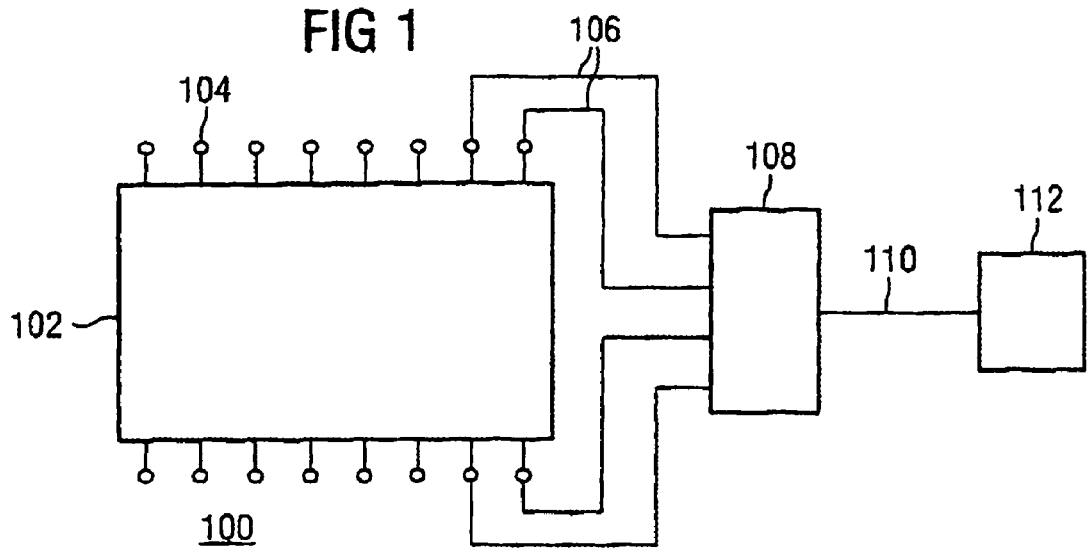
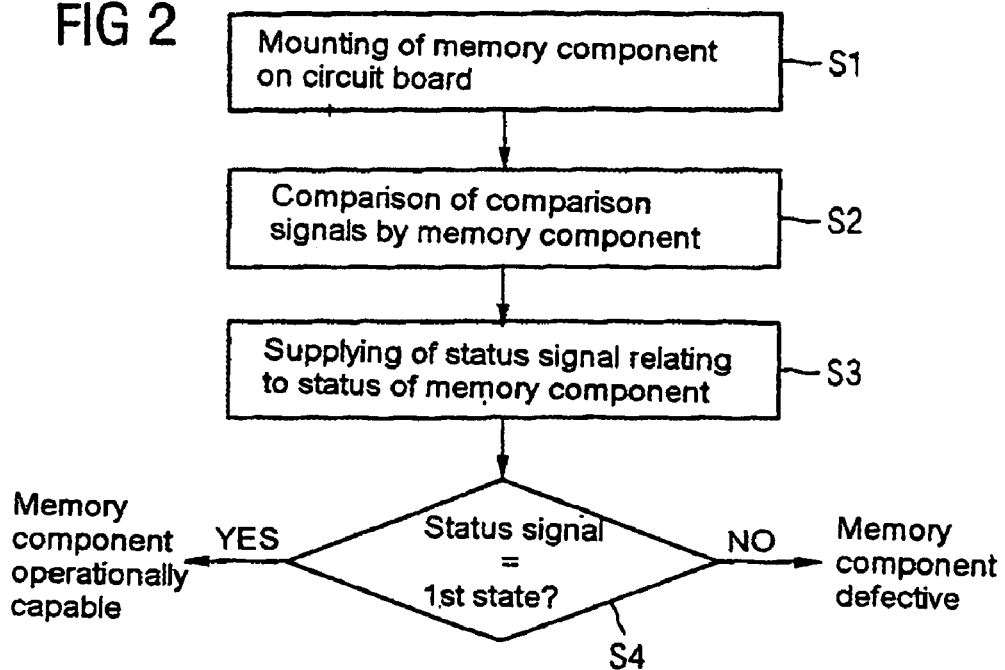

APPARATUS AND METHOD FOR TESTING A DEVICE FOR STORING DATA

TECHNICAL FIELD

The present invention relates to an apparatus and a method for testing a device for storing data and to a circuit board.

BACKGROUND ART

Memory chips are tested, inter alia, at the front end, i.e. at the wafer level, if the wafer has not yet been sawn into individual components and they are not yet located in housings or tested on burn-in boards. Front-end testing has the advantage that contact can be made with specific points on the chip using sharp needles and voltages or currents can be measured. Once the chip is mounted in its housing, these measuring points can no longer be accessed from the outside. Burning-in is an artificial aging of chips at a high temperature and high operating voltage. If the error rate of memory chips is plotted against their age, a characteristic curve is obtained which is similar to the shape of a bathtub, i.e. most chips are defective from the start or only have a defect after a relatively long time. For this reason, these chips are aged artificially and all components which become faulty during this process are eliminated before delivery. Burning-in is carried out here in a type of oven and, for this purpose, electrical contact must be made with the memory modules, and they are therefore located on bases which are arranged in groups on a circuit board or a burn-in board.

During normal use in a personal computer (PC), a memory chip typically has 16 or 32 pins in which data is supplied simultaneously. During the testing of these memory chips, a line must therefore be laid to each pin of the memory chip and the information flowing in it must be checked for its correctness, for example using a comparator.

During the testing of memory chips, the test mode in which the memory module knows the data (set point data) which it is intended to supply and compares it independently with stored data (actual data) has been used for some time both at the wafer level (front-end) and when testing memory chips at the burn-in-board level. If it is assumed, for example, that a logic "1" is to be stored in each cell of the memory chip but a logic "0" occurs at least once in a memory cell during the reading out of the actually stored data, then the chip is faulty. If the chip is capable of carrying out this test itself it can signal the result of the test at its pins.

As is clear from the above, the function of a plurality of memory cells is usually tested simultaneously in the memory chip, while the result of the test is usually output to fewer pins of the chip than the number of memory cells which is being tested simultaneously. In this case, the term "data compression" is used. The data compression is greater the fewer the number of pins used to output the test result. If, for example, instead of the 16 or 32 pins of the memory chip, only one pin is used for test purposes, a maximum degree of data compression is achieved. In the case of, for example, a defective memory module, the test result is then output to a single pin as a signal with a logically high state ("1"), and as a signal with a logically low state ("0") in the case of a functionally capable memory chip. This provides a saving, for example, in terms of lines and comparators for the testing.

However, in the case of front-end testing, the result of a test is usually not transmitted to one but rather to a plurality of pins because it is thus possible to locate a fault in the memory chip more precisely. The test result for various memory areas or addresses of the chip is output at different pins. The result can generally be output at different pins depending on the address, burst bit and data output (DQ). A burst bit is a bit in which, for example in the case of a read access to the memory module, not only one information item (bit) is output per data output but rather a plurality of bits are output. This bit sequence is referred to as a "burst". Data compression can comprise, for example, not only a plurality of data outputs but also a plurality of burst bits.

On the other hand, during the testing of memory chips on burn-in boards no value is placed on the point at which a chip is defective, but rather on whether it is defective or not so that it can then be eliminated.

Both test methods must then be integrated on one chip in order to permit a test both at the wafer level and at the burn-in-board level. It is necessary here to be able to locate the front-end test fault in the memory. This is possible only if the test result is output at a plurality of pins (relatively small data compression) of the memory module although only one chip would be sufficient for the test on burn-in boards (high data compression). However, in order to save chip area, different degrees of data compression are generally not implemented so that the test result is output at a plurality of pins, which does not constitute an optimum state for the burn-in-board level.

A disadvantage of implementing memory chips so that the test results are output at a plurality of pins of the memory chip is that, for example, a line of a comparator has to be led to each of the pins which supply test results during the test of the memory chip on the burn-in board, and the signals on the individual lines in a test device have to be compared, for example using an OR logic element if a logic "1" corresponds to a defect, in order to be able to determine the status of the memory chip.

SUMMARY OF THE INVENTION

The object of the present invention is therefore to provide an apparatus and a method for testing a device for storing data and a circuit board which permit less costly testing of a device for storing data.

This object is achieved by means of an apparatus for testing a device for storing data according to claim 1, a method for testing a device for storing data according to claim 11 and a circuit board according to claim 12.

Advantageous developments and improvements of the testing apparatus specified in claim 1 and the circuit board specified in claim 11 are given in the subclaims.

According to one preferred development, the device for comparing the states of the comparison signals is arranged in the vicinity of the storage device.

An advantage of this preferred development is that, for example, there is, on a circuit board of every base of a storage device, for example a memory chip, a comparison device, for example a logic gate, which logically links the individual results so that it is sufficient if only a single comparator line is led to each of these gates. This not only enables the layout or the design of the circuit board, for example of the burn-in board, to be simplified but additionally considerably reduces the number of comparator channels which are required on a test apparatus, which under certain circumstances permits more components to be mounted on the circuit board.

Earlier, comparator lines were led to each of the pins of a memory chip. The invention makes it possible to lead only a single line to the gate which is located directly on the base and whose result is then evaluated. If the number of lines is thus greatly reduced in the design, these lines cannot only be laid more easily, because it is necessary to allow for a much smaller number of intersection points, but also the lines can be made wider, which results in lower costs.

In addition to simplifying the design, the further advantage is obtained that comparator lines become free for other memory modules. If the number of comparator lines therefore happens to be the limiting factor, a larger number of modules can then be tested.

According to a further preferred development, the first state of the comparison signal is a logically high state, and the second state of the comparison signal is a logically low state, and the device for comparing the states of the comparison signals is an AND logic element.

According to a further preferred development, the first state of the comparison signal is a logically low state, and the second state of the comparison signal is a logically high state, and the device for comparing the states of the comparison signals is an OR logic element.

According to a further preferred development, the device for comparing the states of the comparison signals is that a NAND logic element or NOR logic element or a combination of the logic elements NAND and NOR.

One advantage of these preferred developments is that the use of a single logic element in the vicinity of the base of a storage device simplifies the complexity of the design of, for example, a circuit board.

According to a further preferred development, the circuit board has a circuit board for aging a device for storing data at a high temperature and high operating voltage, i.e. a burn-in board.

According to a further preferred development, the pins which are assigned to the comparison signal are connected to inputs of the device for comparing the states of the comparison signals via lines.

According to a further preferred development, the device for comparing the states of the comparison signals and for supplying a status signal has an output for the status signal, which output is connected to an input of a test apparatus via a line.

According to a further preferred development, the storing device is an electronic memory chip, for example a semiconductor memory chip.

According to a further preferred development, the storage device is mounted on the circuit board by means of a base.

BRIEF DESCRIPTION OF THE DRAWINGS

Preferred exemplary embodiments of the present invention are explained in more detail below with reference to the appended drawings, in which:

FIG. 1 is a preferred exemplary embodiment of an apparatus according to the present invention; and FIG. 2 shows a preferred exemplary embodiment of a method according to the present invention.

FIG. 1 shows an apparatus for testing the device 102 for storing data. The device 102 for storing data may be, for example, a memory component or a memory chip, for example an electronic semiconductor memory.

DETAILED DESCRIPTION OF THE INVENTION

The storage device 102 has a plurality of storage areas which are, for example, each composed of a plurality of memory cells and a plurality of pins 104, for example contact pins for inputting and outputting data. In addition, the storage device 102 has a device for comparing actual data with set point data for individual storage areas of the plurality of storage areas, and a device for supplying a comparison signal 106 for each storage area. The comparison signal 106 has a first state if the actual data is identical to the set point data, and has a second state if the actual data is not identical to the set point data. Each comparison signal which is assigned to a storage area is respectively output at a pin of the plurality of pins 104 of the device for storing data.

If a "1" is to be stored, for example, in a memory cell of a storage area of a storage device, for example a memory chip, but "0" occurs during the reading out of the actually stored data, the memory cell, and thus the storage area, are faulty and, for this case, the comparison device supplies, as the result of the comparison, a comparison signal which has the second state, to a single pin which is assigned to the respective storage area with the defective memory cell.

The apparatus for testing a storage device 102 has a circuit board 100 on which the device 102 for storing data can be mounted. The circuit board 100 is preferably a circuit board which is used for aging a device 102 for storing data at a high temperature and high operating voltage, and which is generally referred to as a burn-in circuit board. The device 102 for storing data is preferably mounted here on the circuit board 100 by means of a base.

The apparatus for tesing a device 102 for storing data also has a device 108 for comparing the states of the comparison signals at the pins of the storage device 102 which are assigned to the comparison signals 106, and for supplying a status signal 110. The status signal 110 has a first state if all the comparison signals have the first state, and has a second state if at least one comparison signal has the second state. The first state of the status signal 110 indicates that the storage device 108 is operationally capable, and the second state of the status signal 110 indicates that the storage device 102 is defective. The comparison device 108 is preferably arranged in the vicinity of the storage device 102, for example directly on the base of the storage device 102.

In a first variant of the device 108 for comparing the states of the comparison signals, the first state of the comparison signal is a logically high state, and the second state of the comparison signal is a logically low state, and the device 108 for comparing the states of the comparison signals is an AND logic element or an AND gate. In a second variant of the device 108 for comparing the states of the comparison signals, the first state of the comparison signal is a logically low state, and the second state of the comparison signal is a logically high state, and the device 108 for comparing the states of the comparison signals is an OR logic element or an OR gate. In further variants of the device 108 for comparing the states of the comparison signals, said device 108 can have a NAND logic element or a NOR logic element and any suitable combination of the NOT, AND, OR logic elements, for example a NAND logic element, followed by a NOR logic element in order to represent an AND logic element.

The pins which are assigned to the comparison signals 106 are preferably connected to the inputs of the device 108 for comparing the states of the comparison signals via lines, for example conductor tracks on a burn-in circuit board.

The device 108 for comparing the states of the comparison signals and for supplying a status signal 110 preferably has an output for supplying the status signal 110 which is connected to an input of a test apparatus 112 via a line. The line here preferably has a part which is located, for example, as conductor tracks on a burn-in circuit board and a part which has comparator lines which are led to the test apparatus.

A further preferred exemplary embodiment of the present invention comprises a circuit board which has the above-described device 102 for storing data and the above-described device 108 for comparing the states of the comparison signals at the pins of the storage device 102, and for supplying a status signal 110.

FIG. 2 shows a preferred exemplary embodiment of a method for testing an apparatus for storing data according to the present invention.

The device for storing data has storage space which has a plurality of storage areas, a plurality of pins 104 for inputting and outputting data, a device for comparing actual data with set point data for individual storage areas of the plurality of storage areas and a device for supplying a comparison signal 106 for each storage area, which comparison signal 106 has a first state if the actual data is identical to the set point data, and a second state if the actual data is not identical to the set point data, to in each case one pin of the plurality of pins 104.

In a first step S1 of the method in FIG. 2, a storage device 102, for example a memory component, is mounted on a circuit board 100, usually by means of a base.

In a step S2, the states of the comparison signals at the pins of the storage device 102 which are assigned to the comparison signals 106 are compared.

In a step S3, a status signal 110 is supplied which has a first state if all the comparison signals have the first state, and a second state if at least one comparison signal has the second state. The first state of the status signal 110 indicates here that the storage device 102 is operationally capable, and the second state of the status signal 110 indicates that the storage device 102 is defective.

In a step S4, it is sensed whether the status signal has the first state, and the information indicating that the storage device 102 is operationally capable or defective is output as a function of this.

Although the present invention is described above by reference to preferred exemplary embodiments, it is not restricted to them but rather can be modified in a wide variety of ways.

One advantage of the present invention is that, in contrast to known solution approaches in which a comparator line is led to each of the pins of a memory component, according to the invention only a single line is led directly to a gate located at the base of a memory component. As a result, the number of lines is greatly reduced in the design of, for example, a burn-in circuit board. The lines can also be laid more easily because a much smaller number of intersection points has to be taken into account, and said lines can be made wider, which results in lower expenditure.

A further advantage of the present invention is that, in addition to simplifying the design, comparator lines become free for other memory components. If the number of comparator lines is the limiting factor, it is thus possible to test a higher number of memory components.

List of reference symbols:

| | |
|---|---|
| 100 | Circuit board |
| 102 | Device for storing data |
| 104 | Pins |
| 106 | Comparison signal |

-continued

List of reference symbols:

| | |
|---|---|
| 108 | Device for comparing and supplying |
| 110 | Status signal |
| 112 | Test apparatus |
| S1 | Mounting step |
| S2 | Comparison step |
| S3 | Supply step |
| S4 | Determining step |

The invention claimed is:

1. An apparatus for testing a storage device for storing data, which has a storage space having a plurality of storage areas, a plurality of pins for inputting and outputting data, a device for comparing actual data with set point data for individual storage areas of the plurality of storage areas and a device for supplying a comparison signal for each storage area, wherein each comparison signal has a first state if the actual data is identical to the set point data for indicating that the storage area is operationally capable, and has a second state if the actual data is not identical to the set point data for indicating that the storage area is defective, to in each case one pin of the plurality of pins, the testing apparatus comprising:
   (a) a circuit board on which the storage device can be mounted; and
   (b) a device for comparing the states of the comparison signals at the pins of the storage device which are assigned to the comparison signals, and for supplying a status signal which has a first state if all the comparison signals have the first state, and has a second state if at least one comparison signal has the second state, the first state of the status signal indicating the storage device is operationally capable, and the second state of the status signal indicating the storage device is defective.

2. The apparatus according to claim 1, wherein the device for comparing the states of the comparison signals is arranged in the vicinity of the storage device.

3. The apparatus according to claim 1, wherein the first state of the comparison signal is a logically high state and the second state of the comparison signal is a logically low state, and the device for comparing the states of the comparison signals is an AND logic element.

4. The apparatus according to claim 1, wherein the first state of the comparison signal is a logically low state and the second state of the comparison signal is a logically high state, and the device for comparing the states of the comparison signals is an OR logic element.

5. The apparatus according to claim 1, wherein the device for comparing the states of the comparison signals is a NAND logic element or NOR logic element or a combination of the NOT, AND, and OR logic elements.

6. The apparatus according to claim 1, wherein the circuit board has a circuit board for aging a device for storing data at a high temperature and operating voltage.

7. The apparatus according to claim 1, wherein the pins which are assigned to the comparison signals are connected to inputs of the device for comparing the states of the comparison signals via lines.

8. The apparatus according to claim 1, wherein the device for comparing the states of the comparison signals and for supplying a status signal has an output for the status signal which is connected to an input of a test apparatus via a line.

9. The apparatus according to claim 1, wherein the storage device has an electronic memory chip.

10. The apparatus according to claim 1, wherein the storage device is mounted on the circuit board by means of a base.

11. A method for testing a storage device for storing data, which has a storage space having a plurality of storage areas, a plurality of pins for inputting and outputting data, a device for comparing actual data with set point data for individual storage areas of the plurality of storage areas and a device for supplying a comparison signal for each storage area, wherein each comparison signal has a first state if the actual data is identical to the set point data for indicating that the storage area is operationally capable, and a second state if the actual data is not identical to the set point data for indicating that the storage area is defective, to in each case one pin of the plurality of pins, the method having the following steps:
(a) mounting of the storage device on a circuit board; and
(b) comparing the states of the comparison signals at the pins of the storage device which are assigned to the comparison signals, and supplying of a status signal which has a first state if all the comparison signals have the first state, and a second state if at least one comparison signal has the second state, the first state of the status signal indicating the storage device is operationally capable, and the second state of the status signal indicating the storage device is defective.

12. A circuit board comprising:
(a) a storage device for storing data, which has a storage space having a plurality of storage areas, a plurality of pins for inputting and outputting data, a device for comparing actual data with set point data for individual storage areas of the plurality of storage areas and a device for supplying a comparison signal for each storage area, wherein comparison signal has a first state if the actual data is identical to the set point data for indicating that the storage area is operationally capable, and a second state if the actual data is not identical to the set point data for indicating that the storage area is defective, to in each case one pin of the plurality of pins; and
(b) a device for comparing the states of the comparison signals at the pins of the storage device which are assigned to the comparison signals, and for supplying a status signal which has a first state if all the comparison signals have the first state, and has a second state if at least one comparison signal has the second state, the first state of the status signal indicating the storage device is operationally capable, and the second state of the status signal indicating the storage device is defective.

13. The circuit board according to claim 12, wherein the device for comparing the states of the comparison signals is arranged in the vicinity of the storage device.

14. The circuit board according to claim 12, wherein the first state of the comparison signal is a logically high state, and the second state of the comparison signal is a logically low state, and the device for comparing the states of the comparison signals is an AND logic element.

15. The circuit board according to claim 12, wherein the first state of the comparison signal is a logically low state and the second state of the comparison signal is a logically high state, and the device for comparing the states of the comparison signals is an OR logic element.

16. The circuit board according to claim 12, wherein the device for comparing the states of the comparison signals is a NAND logic element or NOR logic element or a combination of the NOT, AND, and OR logic elements.

17. The circuit board according to claim 12, wherein circuit board has a circuit board for aging a device for storing data at a high temperature and operating voltage.

18. The circuit board according to claim 12, wherein the pins which are assigned to the comparison signals are connected to inputs of the device for comparing the states of the comparison signals via lines.

19. The circuit board according to claim 12, wherein the device for comparing the states of the comparison signals and for supplying a status signal has an output for the status signal which is connected to an input of a test apparatus via a line.

20. The circuit board according to claim 12, wherein the storage device is an electronic memory chip.

21. The circuit board according to claim 12, in which the storage device is mounted on the circuit board by means of a base.

* * * * *